(12) United States Patent
Jin et al.

(10) Patent No.: US 12,040,213 B2
(45) Date of Patent: Jul. 16, 2024

(54) PROCESSING TAPE AND METHOD OF FABRICATING A SEMICONDUCTOR DEVICE USING THE SAME

(71) Applicant: Samsung Electronics Co., Ltd., Suwon-si (KR)

(72) Inventors: Hwail Jin, Seongnam-si (KR); Seon Ho Lee, Cheonan-si (KR); Yeongseok Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 495 days.

(21) Appl. No.: 17/191,163

(22) Filed: Mar. 3, 2021

(65) Prior Publication Data

US 2022/0020627 A1    Jan. 20, 2022

(30) Foreign Application Priority Data

Jul. 14, 2020    (KR) ........................ 10-2020-0086874

(51) Int. Cl.
| | |
|---|---|
| *H01L 21/78* | (2006.01) |
| *C09J 7/24* | (2018.01) |
| *C09J 7/38* | (2018.01) |
| *C09J 7/40* | (2018.01) |
| *H01L 21/683* | (2006.01) |

(52) U.S. Cl.
CPC .......... *H01L 21/6836* (2013.01); *C09J 7/241* (2018.01); *C09J 7/385* (2018.01); *C09J 7/401* (2018.01); *C09J 7/403* (2018.01); *H01L 21/78* (2013.01); *C09J 2423/006* (2013.01); *C09J 2433/005* (2013.01); *C09J 2483/005* (2013.01); *Y10T 428/14* (2015.01); *Y10T 428/1457* (2015.01); *Y10T 428/1476* (2015.01)

(58) Field of Classification Search
None
See application file for complete search history.

(56) References Cited

U.S. PATENT DOCUMENTS

| | | | | |
|---|---|---|---|---|
| 4,977,006 A | * | 12/1990 | Smith ....................... | G09F 3/02 156/247 |
| 7,255,919 B2 | | 8/2007 | Sakata et al. | |
| 7,488,539 B2 | | 2/2009 | Kozakai et al. | |
| 9,006,081 B2 | * | 4/2015 | Ahn ..................... | H01L 21/6835 438/455 |
| 10,202,525 B2 | * | 2/2019 | Park ........................ | C09J 151/04 |
| 10,526,513 B2 | | 1/2020 | Kim et al. | |
| 2008/0057251 A1 | * | 3/2008 | Griswold ............... | C09J 183/08 428/40.1 |
| 2008/0166513 A1 | * | 7/2008 | Ikeda ........................ | C09J 7/10 428/41.8 |
| 2009/0075008 A1 | | 3/2009 | Hwang et al. | |
| 2016/0039188 A1 | | 2/2016 | Namikawa | |
| 2019/0218425 A1 | | 7/2019 | Schwartz et al. | |
| 2020/0006087 A1 | | 1/2020 | Yamaguchi et al. | |

FOREIGN PATENT DOCUMENTS

| | | | |
|---|---|---|---|
| JP | 3205283 B | 9/2001 | |
| JP | 2011132309 A | 7/2011 | |
| JP | 5905704 B2 | 4/2016 | |
| JP | 6443293 B2 | 12/2018 | |
| JP | 2019093686 A | 6/2019 | |
| KR | 101486052 B1 | 1/2015 | |
| KR | 1020170096881 A | 8/2017 | |
| WO | WO-2015020413 A1 * | 2/2015 | ............ C08F 255/10 |

* cited by examiner

*Primary Examiner* — Anish P Desai
(74) *Attorney, Agent, or Firm* — Muir Patent Law, PLLC

(57) ABSTRACT

A processing tape may include a base layer, an adhesive layer disposed on the base layer, a protection release film on the adhesive layer, and a first release layer interposed between the adhesive layer and the protection release film. The first release layer may include a silicone-based material and may be non-photo-curable.

8 Claims, 10 Drawing Sheets

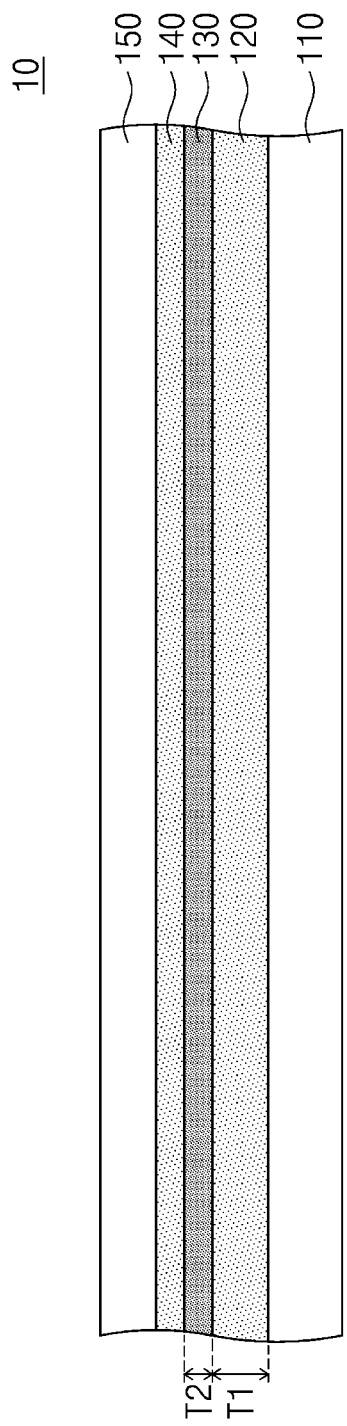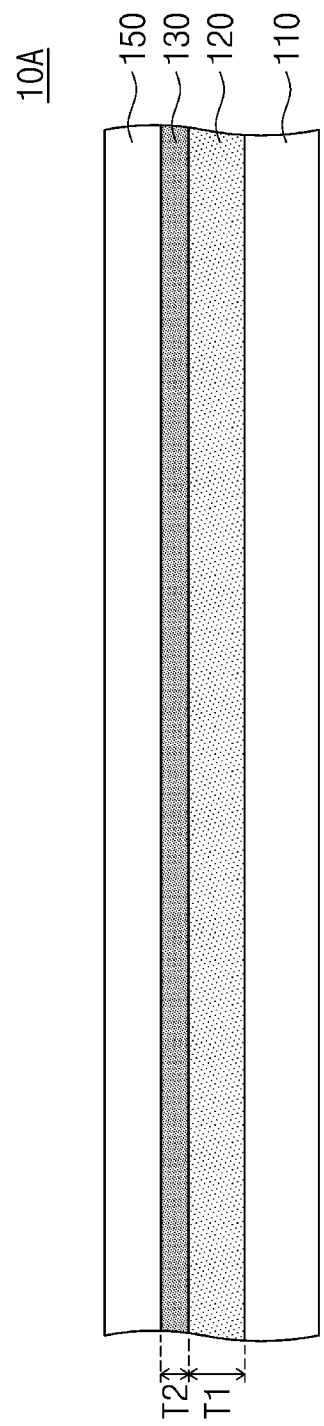

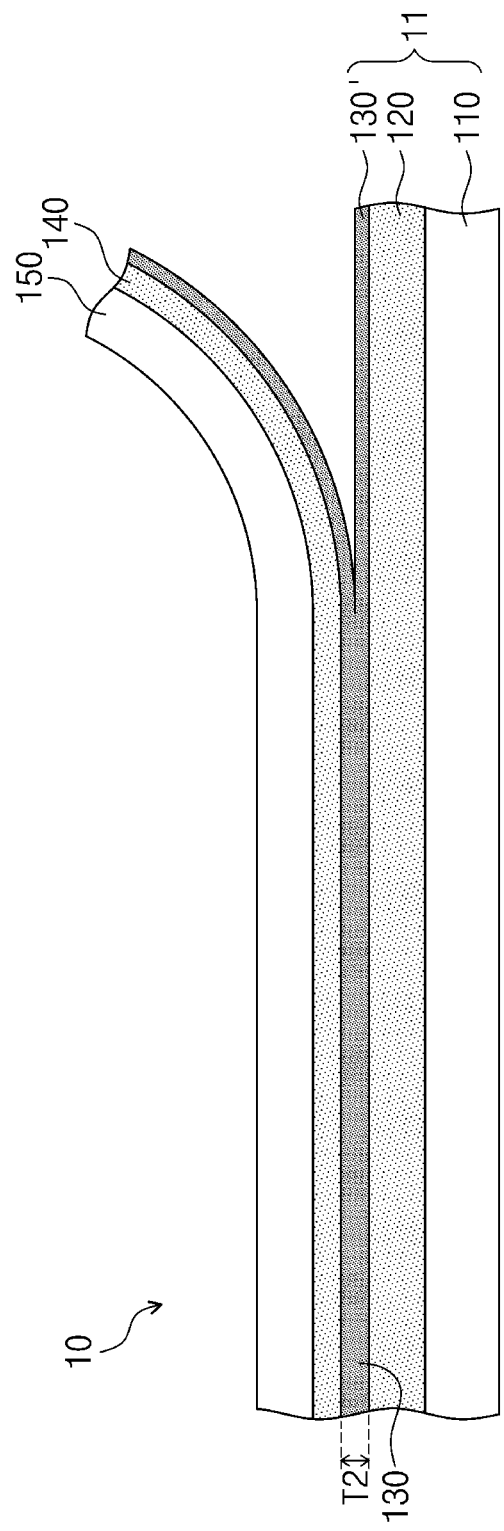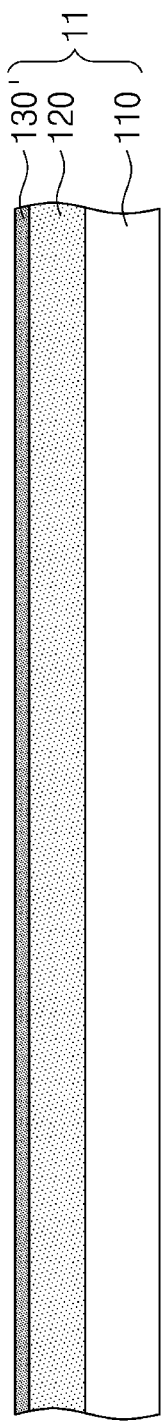

PROCESSING TAPE AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2020-0086874, filed on Jul. 14, 2020, in the Korean Intellectual Property Office, the entire contents of which are hereby incorporated by reference.

BACKGROUND OF THE INVENTION

The present disclosure relates to a processing tape, and in particular, to a processing tape which is used in a process of fabricating a semiconductor device.

With the development of the electronics industry, it becomes possible to cost-effectively manufacture light, small, fast, and high-performance electronic products. The electronic product includes a semiconductor device, which is fabricated using a wafer-level substrate. A plurality of semiconductor chips are formed by dicing the substrate. A processing tape, such as a dicing tape, is used in the process of dicing the substrate.

SUMMARY

An embodiment of the inventive concept provides a processing tape with improved adhesive strength and a method of fabricating a semiconductor device using the same.

An embodiment of the inventive concept provides a processing tape with improved releasing property and a method of fabricating a semiconductor device using the same.

According to an embodiment of the inventive concept, a processing tape may include a base layer, an adhesive layer disposed on the base layer, a protection release film on the adhesive layer, and a first release layer interposed between the adhesive layer and the protection release film. The first release layer may include a silicone-based material and may be non-photo-curable.

According to an embodiment of the inventive concept, a method of fabricating a semiconductor device may include preparing a processing tape including an adhesive layer, a first release layer, and a protection release film stacked on a base layer, removing the protection release film while leaving at least a portion of the first release layer, which is used as a first release film, on the adhesive layer, attaching a substrate structure to the first release film, performing a processing process on the substrate structure to form a processed substrate structure, and detaching the processed substrate structure from the first release film. The first release film may be non-photo-curable.

According to an embodiment of the inventive concept, a processing tape may include a base layer including a polymer, a pressure sensing adhesive layer disposed on the base layer, a protection release film on the pressure sensing adhesive layer, a first release layer interposed between the pressure sensing adhesive layer and the protection release film, and a second release layer interposed between the first release layer and the protection release film, the second release layer including silicone acrylate. The first release layer may be non-photo-curable, and the pressure sensing adhesive layer may include a photo-curable material. The first release layer may be 0.01 phr to 30 phr of the pressure sensing adhesive layer, and a thickness of the first release layer ranges from 0.01 µm to 10 µm. The first release layer may include a material represented by chemical formula 1.

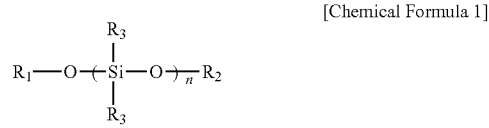

[Chemical Formula 1]

where $R_1$ and $R_2$ may each independently include one selected from a hydrogen, an alkyl group having 1 to 5 carbon atoms, an alkyl substituted silyl group having 1 to 5 carbon atoms, —$NH_2$, an amino alkyl group having 1 to 5 carbon atoms, an alkyl amino group having 1 to 5 carbon atoms, a hydroxyl group (—OH), a hydroxy alkyl group having 1 to 5 carbon atoms, an isocyanate group (NCO), an alkyl group having 1 to 5 carbon atoms substituted with isocyanate, and an alkyl group having 1 to 5 carbon atoms substituted with epoxy group, $R_3$ each independently includes one selected from an alkyl group having 1 to 3 carbon atoms and n is from 1 to 410.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1 is a sectional view illustrating a processing tape according to an embodiment of the inventive concept.

FIG. 2 is a sectional view illustrating a processing tape according to an embodiment of the inventive concept.

FIGS. 4A to 4F are sectional views illustrating a method of fabricating a semiconductor device, using a processing tape according to an embodiment of the inventive concept.

DETAILED DESCRIPTION

Figure 3A:
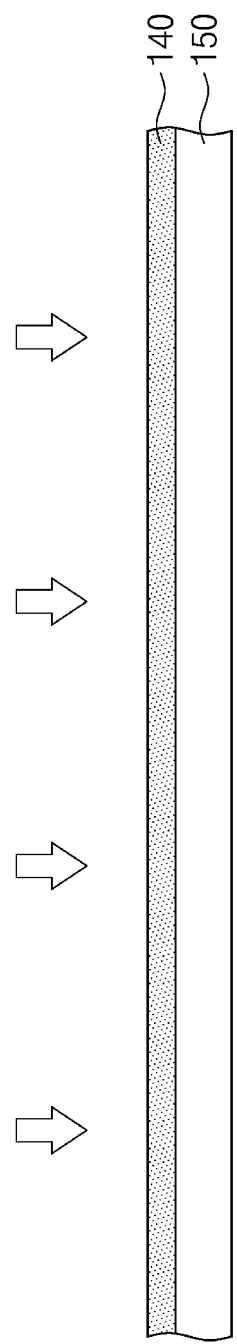
FIGS. 3A to 3C are sectional views illustrating a method of fabricating a processing tape, according to an embodiment of the inventive concept.

Example embodiments of the inventive concepts will now be described more fully with reference to the accompanying drawings, in which example embodiments are shown.

FIG. 1 is a sectional view illustrating a processing tape according to an embodiment of the inventive concept.

Referring to FIG. 1, a processing tape 10 may include a base layer 110, an adhesive layer 120, a first release layer 130, a second release layer 140, and a protection release film 150. The processing tape 10 may be a dicing tape. For example, the processing tape 10 may be used in a process of dicing a wafer-level substrate.

The base layer 110 may include at least one of organic materials (e.g., polymeric materials). For example, the base layer 110 may include at least one of poly ethyleneterephthalate (PET), poly olefin (PO), poly (vinyl alcohol) (PVA), poly(l-naphthylamine) (PNA), poly ether ketone (PEEK), and/or mixtures thereof. For example, the base layer 110 may include homopolymers or blend polymers. The base layer 110 may be a single layer or a multiple layer.

The adhesive layer 120 may be disposed on the base layer 110. The adhesive layer 120 may be, for example, a pressure sensitive adhesive (PSA) layer. The adhesive layer 120 may contain a photo-curable material which is in an uncured state. For example, example, the adhesive layer 120 may include an acrylate-based material (e.g., acrylate polymer). The adhesive layer 120 may further include at least one of a cross-linking agent, a photocuring agent, or an additive agent. The additive agent may further include at least one of a UV absorbing agent and a coating leveling agent. The UV absorbing agent may be formed of or include a material having an aromatic ring or a conjugate structure. For example, the UV absorbing agent may include benzophenone and/or derivatives thereof. The coating leveling agent may include a silicone-based surfactant. A thickness T1 of the adhesive layer 120 may range from 5 μm to 50 μm.

The first release layer 130 may be disposed on the adhesive layer 120. For example, the first release layer 130 may be interposed between the adhesive layer 120 and the protection release film 150. The first release layer 130 may be in direct or physical contact with the adhesive layer 120. The first release layer 130 may be attached to the base layer 110 by the adhesive layer 120. The first release layer 130 may include a non-photosensitive material. The non-photosensitive material may mean a material that is not cured by light. In other words, the first release layer 130 may include a non-photo-curable material. The non-photo-curable material may have unintentional or negligible changes under UV light. For example, the non-photo-curable material may have substantially no cross linking occur under UV light. The molecular weight of the non-photo-curable material may undergo substantially no change when exposed to light, or the molecular weight of the non-photo-curable material may change less than 1% under UV light. The first release layer 130 may include a thermosetting material or a non-reactive material. In the present specification, the non-reactive property may mean a non-thermosetting property, a non-photocurable property, and a chemically non-reactive property. The chemically non-reactive property may mean that the material does not participate in chemical reaction with other materials. The first release layer 130 may include a silicone-based material. For example, the first release layer 130 may include a silicone-based material represented by the following chemical formula 1. A weight average molecular weight (Mw) of the silicone-based material may range from 100 g/mol to 30,000 g/mol.

[Chemical Formula 1]

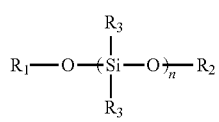

In the chemical formula 1, $R_1$ and $R_2$ may each independently include one selected from a hydrogen, an alkyl group having 1 to 5 carbon atoms, an alkyl substituted silyl group having 1 to 5 carbon atoms, —$NH_2$, an amino alkyl group having 1 to 5 carbon atoms, an alkyl amino group having 1 to 5 carbon atoms, a hydroxyl group (—OH), a hydroxy alkyl group having 1 to 5 carbon atoms, an isocyanate group (NCO), an alkyl group having 1 to 5 carbon atoms substituted with isocyanate, and an alkyl group having 1 to 5 carbon atoms substituted with epoxy group, $R_3$ may each independently include one selected from an alkyl group having 1 to 3 carbon atoms (e.g. a methyl, ethyl or propyl group) and n is from 1 to 410.

As an example, the first release layer 130 may exhibit a non-reactive property, and in the chemical formula 1, $R_1$ and $R_2$ may be each independently a hydrogen, an alkyl group having 1 to 5 carbon atoms, or an alkyl substituted silyl group having 1 to 5 carbon atoms.

As another example, the first release layer 130 may exhibit a thermosetting property, and in the chemical formula 1, $R_1$ and $R_2$ may each independently include any one selected from —$NH_2$, an amino alkyl group having 1 to 5 carbon atoms, an alkyl amino group having 1 to 5 carbon atoms, —OH, a hydroxy alkyl group having 1 to 5 carbon atoms, an isocyanate group (NCO), an alkyl group having 1 to 5 carbon atoms substituted with isocyanate, and an alkyl group having 1 to 5 carbon atoms substituted with epoxy group. In an embodiment, the first release layer 130 may have a thermosetting property and may be chemically bonded with the adhesive layer 120. A chemical bond may be provided between a bottom surface of the first release layer 130 and a top surface of the adhesive layer 120. In this case, the first release layer 130 may be more strongly fastened to the adhesive layer 120.

The first release layer 130 may be 0.01 phr (parts per hundred rubber) to 30 phr of the adhesive layer 120. A thickness T2 of the first release layer 130 may range from 0.01 μm to 10 μm. The first release layer 130 may have a hydrophobic property.

The second release layer 140 may be disposed on the first release layer 130. For example, the second release layer 140 may be interposed between the first release layer 130 and the protection release film 150. The second release layer 140 may include a different material from the first release layer 130 and may have physical and chemical characteristics different from the first release layer 130. The second release layer 140 may include a photo-curable material. The second release layer 140 may be in a photo-cured state. The second release layer 140 may include a silicone acrylate-based material. In an embodiment, the second release layer 140 may include a material, which is represented by the following chemical formula 2, and/or derivatives thereof. A weight average molecular weight of the material represented by the chemical formula 2 may range from 100 g/mol to 30,000 g/mol. The material represented by the chemical formula 2 may be silicone acrylate.

[Chemical Formula 2]

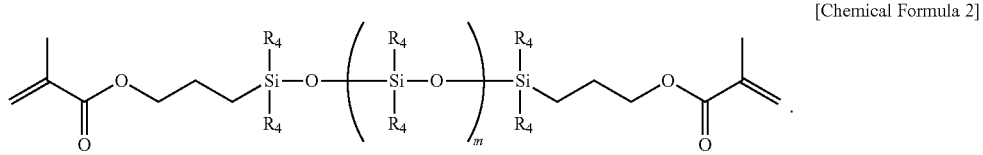

In the chemical formula 2, $R_4$ each independently includes one selected from an alkyl group having 1 to 3 carbon atom (e.g. a methyl, ethyl or propyl group), and m is from 0 to 520.

The second release layer 140 may be 0.00001 phr to 30 phr of the adhesive layer 120.

The protection release film 150 may be disposed on the second release layer 140. The protection release film 150 may include an organic material (e.g., polymer). For example, the protection release film 150 may be formed of or include at least one of poly ethyleneterephthalate (PET), poly olefin (PO), poly (vinyl alcohol) (PVA), poly(l-naphthylamine) (PNA), poly ether ketone (PEEK), and/or mixtures thereof. The protection release film 150 may protect the second release layer 140, the first release layer 130, or the adhesive layer 120 from a physical stress. The physical stress may be an external impact but is not limited thereto. The protection release film 150 may be removed before using the processing tape 10. An example, in which the processing tape 10 is used, will be described with reference to FIGS. 4A to 4F.

FIG. 2 is a sectional view illustrating a processing tape according to an embodiment of the inventive concept. For concise description, a previously described element may be identified by the same reference number without repeating an overlapping description thereof.

Referring to FIG. 2, the processing tape 10A may be a dicing tape. The processing tape 10 may include the base layer 110, the adhesive layer 120, the first release layer 130, and the protection release film 150. The base layer 110, the adhesive layer 120, the first release layer 130, and the protection release film 150 may be substantially the same as those described with reference to FIG. 1. For example, the thickness T1 of the adhesive layer 120 and the thickness T2 of the first release layer 130 may be the same as those described with reference to FIG. 1. However, the processing tape 10 may not include the second release layer 140 of FIG. 1 and the first release layer 130 may be in direct or physical contact with the adhesive layer 120 and the protection release film 150. The layers illustrated in FIGS. 1 and 2 may be directly provided adjacent each other as illustrated, or one or more intervening layers (to aid with strength, adhesion, separation etc) may also be provided between the illustrated layers.

Figure 3B:
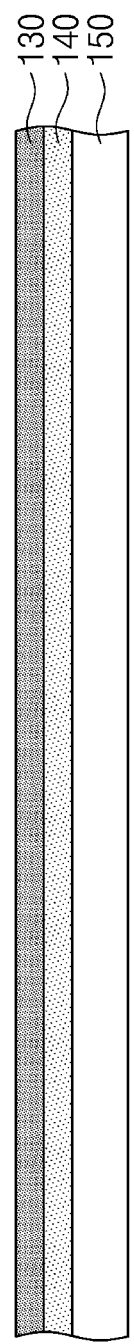
Figure 3C:
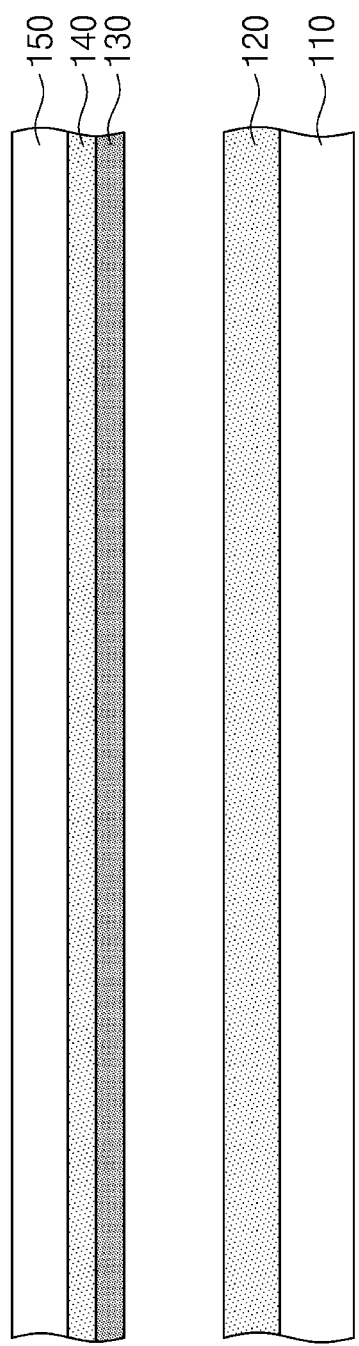

FIGS. 3A to 3C are sectional views illustrating a method of fabricating a processing tape, according to an embodiment of the inventive concept. For concise description, a previously described element may be identified by the same reference number without repeating an overlapping description thereof.

Referring to FIG. 3A, the second release layer 140 may be formed on the protection release film 150. In an embodiment, the formation of the second release layer 140 may include coating a photo-curable material on the protection release film 150. The photo-curable material may include a silicone acrylate-based material. The formation of the second release layer 140 may further include irradiating light to the coated layer. The light may be an ultraviolet (UV) light. The second release layer 140 may be photo-cured by the irradiation of the light. Accordingly, the second release layer 140 may include a photo-cured silicone acrylate-based material. The photo curing may mean an ultraviolet light (UV) curing.

Referring to FIG. 3B, the first release layer 130 may be formed on the second release layer 140. The first release layer 130 may be formed by coating the material, which is represented by the chemical formula 1, on the second release layer 140.

Unlike that shown in the figure, the first release layer 130 may be coated on the second release layer 140, before the irradiation of the light described with reference to FIG. 3A. Thereafter, the light may be irradiated to the first release layer 130. As a result of the irradiation of the light, the second release layer 140 may be photo-cured. Since the first release layer 130 includes a non-photo-curable material, the first release layer 130 may not be affected by the light. For example, the first release layer 130 may not be photo-cured.

Referring to FIG. 3C, the base layer 110 and the adhesive layer 120 may be prepared. The adhesive layer 120 may be provided on the base layer 110. As an example, a photo-curable acrylate-based polymer may be coated on the base layer 110 to form the adhesive layer 120.

The protection release film 150, the second release layer 140, and the first release layer 130, which are formed by the method of FIGS. 3A and 3B, may be prepared. The structure including the protection release film 150, the second release layer 140, and the first release layer 130 may be inverted and then may be placed on the adhesive layer 120 such that the first release layer 130 faces the adhesive layer 120.

Referring to FIGS. 3C and 1, the first release layer 130 may be attached to the adhesive layer 120 such that the first release layer 130 is in physical contact with the adhesive layer 120. The attaching of the first release layer 130 may be performed by a laminating process. The processing tape 10 may be fabricated by the afore-described process.

Alternatively, the protection release film 150 and the second release layer 140 may be prepared, and then the first release layer 130 may be coated not on the second release layer 140 but on the adhesive layer 120. In this case, the second release layer 140 may be disposed on the first release layer 130 such that the second release layer 140 and the first release layer 130 are spaced apart from each other and face each other. Next, the processing tape 10 may be formed by attaching the second release layer 140 to the first release layer 130 through a laminating process.

Unlike that shown in the figure, the process of forming the second release layer 140 may be omitted. In this case, the first release layer 130 may be directly coated on the protection release film 150 or the adhesive layer 120. Thereafter, a stacking process may be performed to form the base layer 110, the adhesive layer 120, the first release layer 130, and the protection release film 150, which are sequentially stacked. The first release layer 130 may be in contact with the adhesive layer 120 and the protection release film 150. In this case, the processing tape 10A may be fabricated to have the structure of FIG. 2.

FIGS. 4A to 4F are sectional views illustrating a method of fabricating a semiconductor device, using a processing tape according to an embodiment of the inventive concept. For concise description, a previously described element may be identified by the same reference number without repeating an overlapping description thereof.

Referring to FIG. 4A, the processing tape 10 may be prepared. The processing tape 10 may be substantially the same as that described with reference to FIG. 1. For example, the processing tape 10 may include the base layer 110, the adhesive layer 120, the first release layer 130, the second release layer 140, and the protection release film 150. Alternatively, as described with reference to FIG. 2, the second release layer 140 may be omitted and the first release layer 130 may be in direct contact with the adhesive layer 120 and the protection release film 150.

Referring to FIGS. 4A and 4B, the protection release film 150 may be removed. Here, the second release layer 140 may also be removed, along with the protection release film 150. The removal of the protection release film 150 and the second release layer 140 may be achieved by a physical method or a mechanical method. The removal of the protection release film 150 may be performed by a user or by a machine operated by a user, and the protection release film 150 may prevent the second release layer 140, the first release layer 130, or the adhesive layer 120 from being damaged during a process of transferring and storing the processing tape 10.

After the process of removing the protection release film 150, at least a portion of the first release layer 130 may be left to form a first release film 130' on the adhesive layer 120. The first release film 130' left on the adhesive layer 120 may be 10 wt % to 50 wt % of the first release layer 130 prior to removing the protection release film 150. The remaining portion of the first release layer 130 may be removed along with the second release layer 140. As a result of the removal of the protection release film 150 and the second release layer 140, a processing release tape 11 may be formed. The processing release tape 11 may include the base layer 110, the adhesive layer 120, and the first release film 130'.

In the case where an interaction between the protection release film 150 and the first release layer 130 is strong, it may be difficult to detach the first release layer 130 from the protection release film 150. A magnitude of the interaction may be represented as an adhesive strength or a bonding strength. In an embodiment, the second release layer 140 may be interposed between the first release layer 130 and the protection release film 150. An adhesive strength between the second release layer 140 and the first release layer 130 may be relatively weak. Accordingly, at least a portion of the first release layer 130 (i.e., the first release film 130') may be left on the adhesive layer 120, after the removal of the protection release film 150 and the second release layer 140. Alternatively, in the case where an adhesive strength between the protection release film 150 and the first release layer 130 is relatively weak, the second release layer 140 may not be provided, as shown in the processing tape 10A of FIG. 2.

Figure 4C:
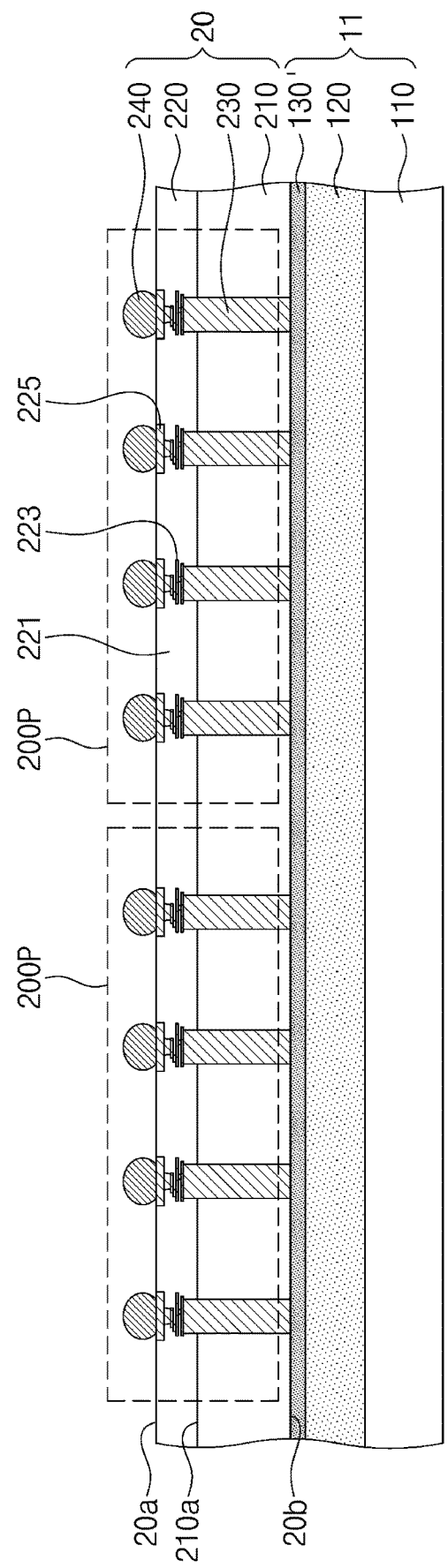

Referring to FIG. 4C, a substrate may be prepared. The substrate may be a substrate structure 20. The substrate structure 20 may include a semiconductor substrate 210, a circuit layer 220, and penetration structures 230. The substrate structure 20 may further include solder bumps 240. The substrate structure 20 may have a first surface 20a and a second surface 20b, which are opposite to each other. The first surface 20a of the substrate structure 20 may correspond to a top surface of the circuit layer 220, and the second surface 20b of the substrate structure 20 may correspond to a bottom surface of the semiconductor substrate 210. Although not shown, a redistribution layer may be further provided on the bottom surface of the semiconductor substrate 210. In this case, the second surface 20b of the substrate structure 20 may correspond to an exposed surface of the redistribution layer.

The substrate structure 20 may be disposed on the processing release tape 11. Here, the second surface 20b of the substrate structure 20 may face a top surface of the first release layer 130. The substrate structure 20 may be attached to the first release layer 130 such that the semiconductor substrate 210 is in physical contact with the first release layer 130.

The substrate structure 20 may be a wafer-level substrate. The semiconductor substrate 210 may be a semiconductor wafer. For example, the semiconductor substrate 210 may be formed of or include a semiconductor material, such as silicon, germanium, or silicon-germanium. Alternatively the wafer can be formed of a non-semiconductor material, and can be a glass, quartz, sapphire or other wafer. The semiconductor substrate 210 may include a bottom surface and a top surface 210a, which are opposite to each other. The bottom surface of the semiconductor substrate 210 may be a rear surface. The top surface 210a of the semiconductor substrate 210 may be a front surface. The circuit layer 220 may be provided on the top surface 210a of the semiconductor substrate 210. The circuit layer 220 may include integrated circuits (not shown), an insulating layer 221, an interconnection structure 223, and chip pads 225. The integrated circuits may be provided on the top surface 210a of the semiconductor substrate 210 and may include transistors. The insulating layer 221 may be disposed on the top surface 210a of the semiconductor substrate 210 to cover the integrated circuits. The insulating layer 221 may include a plurality of stacked layers. The insulating layer 221 may be formed of or include at least one of silicon oxide, silicon nitride, or silicon oxynitride. The interconnection structure 223 may be disposed in the insulating layer 221. The interconnection structure 223 may be electrically connected to the integrated circuits. The interconnection structure 223 may be formed of or include at least one of conductive materials (e.g., copper and/or tungsten). In the present specification, the expression "electrically connected or coupled" may mean that relevant elements are directly connected/coupled to each other or are indirectly connected or coupled to each other through another conductive element. On a top surface of the insulating layer 221, the chip pads 225 may be exposed to the outside. At least one of the chip pads 225 may be electrically connected to the interconnection structure 223. The chip pads 225 may be formed of or include at least one of conductive materials (e.g., aluminum, gold, and/or copper).

The penetration structure 230 may be provided in the circuit layer 220 and the semiconductor substrate 210. For example, the penetration structure 230 may be provided to penetrate the semiconductor substrate 210. In an embodiment, the penetration structure 230 may be provided to penetrate at least a portion of the circuit layer 220. The penetration structure 230 may be electrically connected to at least one of the chip pads 225 or the integrated circuits through the interconnection structure 223. The penetration structure 230 may be formed of or include at least one of conductive materials (e.g., copper, titanium, or tungsten). In an embodiment, a plurality of the penetration structures 230 may be provided.

The solder bumps 240 may be provided on the circuit layer 220 and may be coupled to the chip pads 225, respectively. The solder bumps 240 may include solder balls, solder bumps, pillars, or combinations thereof. The solder bumps 240 may be formed of or include at least one of conductive materials (e.g., tin, lead, silver, and alloys thereof). The solder bumps 240 may be connected to the integrated circuits or the penetration structures 230 through the interconnection structure 223.

The substrate structure 20 may include a plurality of preliminary semiconductor chips 200P. The preliminary semiconductor chips 200P may be connected to each other, without any interface therebetween. The preliminary semiconductor chips 200P may be separated from each other to form semiconductor chips 200, as will be described with reference to FIG. 4D. Each of the preliminary semiconductor chips 200P may include a portion corresponding to the semiconductor substrate 210, a portion corresponding to the circuit layer 220, the penetration structures 230, and the solder bumps 240.

Figure 4D:
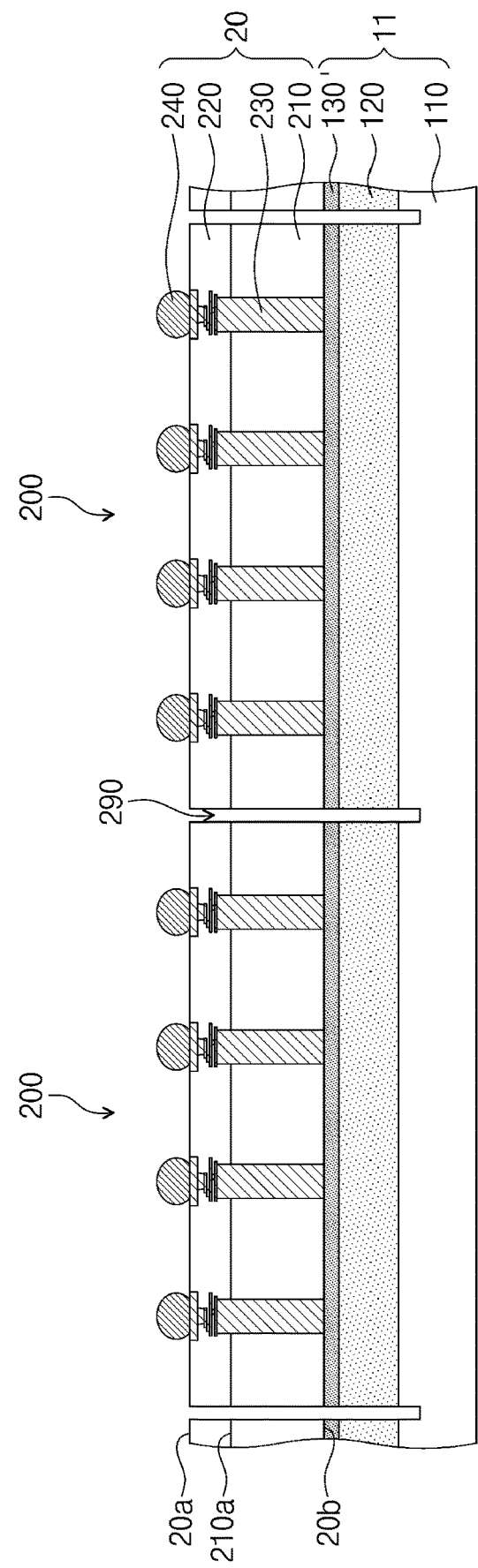

Referring to FIG. 4D, a processing process may be performed on the first surface 20a of the substrate structure 20. The processing process may be a dicing process. The dicing process may include cutting the substrate structure 20 using a cutting wheel or a laser beam. Accordingly, the processed substrate structure 20 may be formed. The processed substrate structure 20 may mean a diced substrate.

As a result of the dicing process, grooves 290 may be formed in the substrate structure 20. Each of the grooves 290 may penetrate the substrate structure 20 from the first surface 20a to the second surface 20b. The preliminary semiconductor chips 200P of FIG. 4C may be separated from each other by the grooves 290 to form the semiconductor chips 200. The semiconductor chips 200 may be horizontally spaced apart from each other. Each of the semiconductor chips 200 may include the diced semiconductor substrate 210, the diced circuit layer 220, the penetration structures 230, and the solder bumps 240. Each of the semiconductor chips 200 may correspond to a portion of the diced substrate structure 20.

A portion of the processing release tape 11 may be diced along with the substrate structure 20, and thus, the grooves 290 may be extended into the processing release tape 11. For example, the grooves 290 may be formed to penetrate at least one of the first release layer 130 and the adhesive layer 120. However, the grooves 290 may not completely penetrate the processing release tape 11.

In an embodiment, an adhesive strength between the first release layer 130 and the substrate structure 20 may be relatively strong. For example, an adhesive strength between the first release film 130' and the semiconductor substrate 210 may range from 0.5 N/inch to 5 N/inch. Accordingly, during the dicing process, the processing release tape 11 may be effectively used to fasten or support the substrate structure 20. For example, the substrate structure 20 may be stably fastened to the adhesive layer 120 and the base layer 110 by the first release layer 130. The adhesive strength between the first release layer 130 and the substrate structure 20 may correspond to the adhesive strength between the first release film 130' and the semiconductor substrate 210, but the inventive concept is not limited to this example.

The processing release tape 11 may be formed by removing the protection release film 150, the second release layer 140, and the portion of the first release layer 130 from the processing tape 10 as described with reference to FIG. 4A. If, in the processing tape 10, the content of the first release layer 130 is greater than 30 phr of the adhesive layer 120 or the thickness T2 of the first release layer 130 is thicker than 10 μm, the adhesive strength between the substrate structure 20 and the first release film 130' of the processing release tape 11 may be deteriorated. In this case, it may be difficult to stably fasten the substrate structure 20 to the processing release tape 11, during the processing process. However, according to an embodiment of the inventive concept, in the processing tapes 10 and 10A of FIGS. 1 and 2, the first release layer 130 may be 0.01 phr to 30 phr of the adhesive layer 120. The thickness T2 of the first release layer 130 may range from 0.01 μm to 10 μm. Accordingly, the substrate structure 20 may be stably fastened to the adhesive layer 120 and the base layer 110 through the first release film 130'.

Figure 4E:
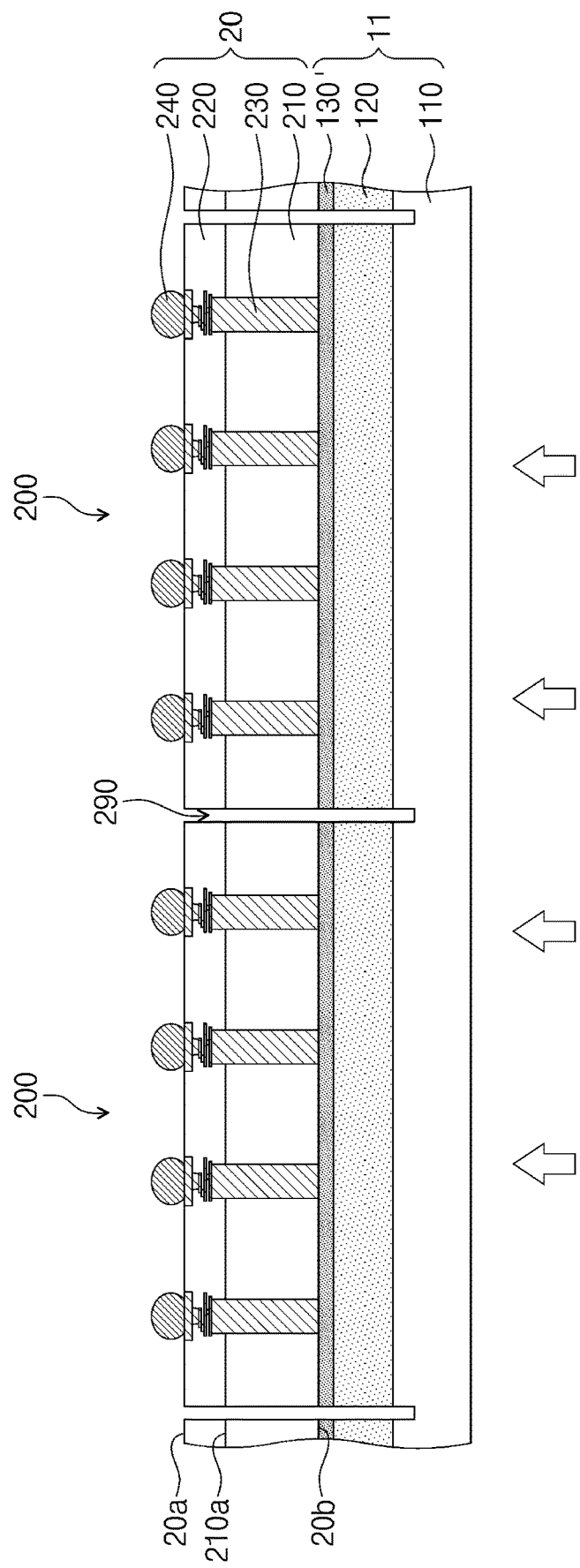

Referring to FIG. 4E, light may be irradiated to the processing release tape 11 and the processed substrate structure 20. The light may be an ultraviolet light. For example, the light may be irradiated to the adhesive layer 120 and the first release film 130'. As a result of the irradiation of the light, the adhesive layer 120 may be photo-cured. As a result of the irradiation of the light, the adhesive strength between the first release film 130' and the semiconductor substrate 210 may be lowered. The adhesive strength between the first release film 130' and the semiconductor substrate 210 after the irradiation of the light may be smaller than the adhesive strength between the first release film 130' and the semiconductor substrate 210 before the irradiation of the light. For example, the adhesive strength between the first release film 130' and the semiconductor substrate 210 after the irradiation of the light may range from 0.01 N/inch (1.02 gf/inch) to 0.05 N/inch (5.10 gf/inch).

Figure 4F:
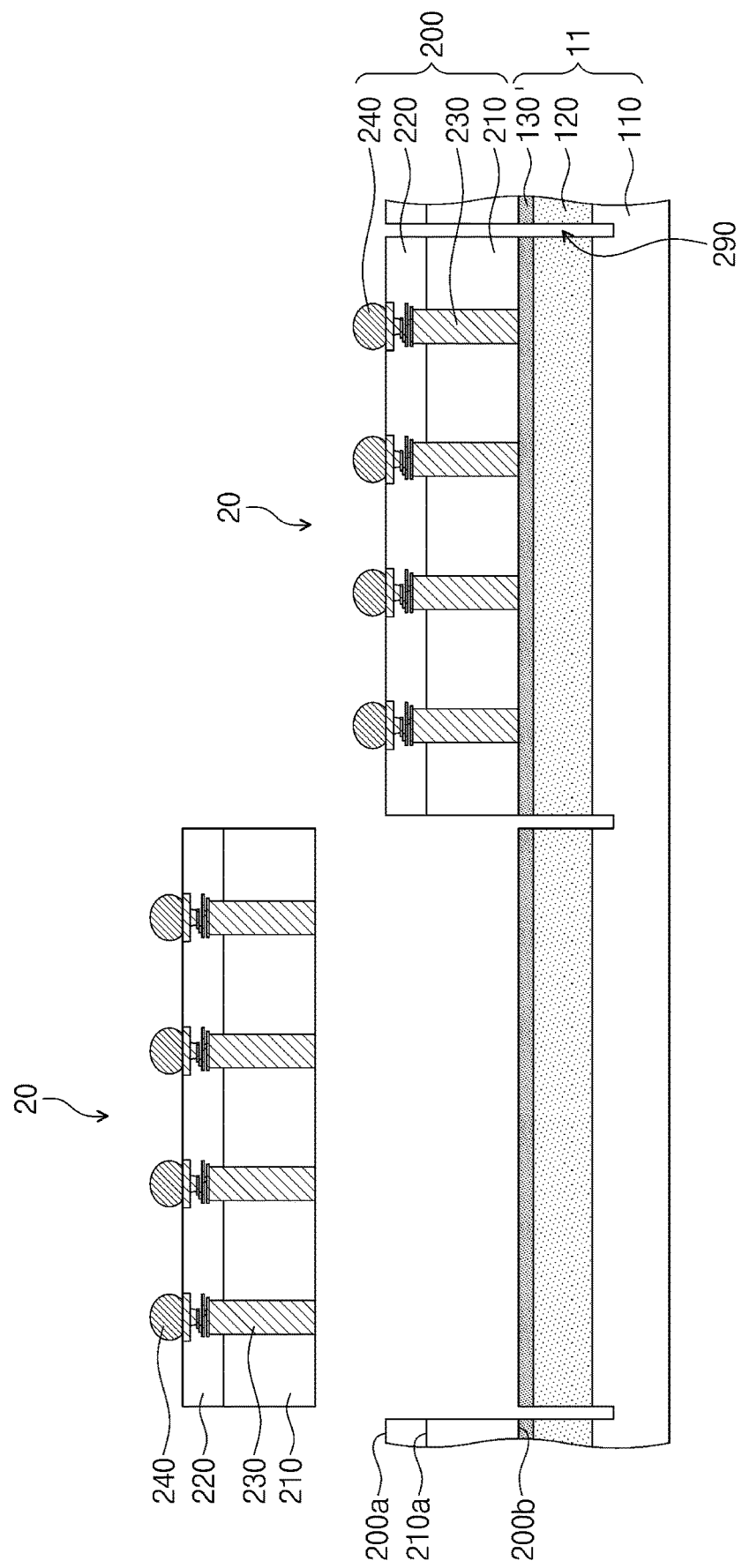

Referring to FIG. 4F, the diced substrate structure 20 may be detached from the first release film 130'. For example, the semiconductor substrate 210 of each semiconductor chip 200 may be detached from the first release film 130' by picking up each of the semiconductor chips 200.

In the case where the first release layer 130 is omitted, the substrate structure 20 may be in direct contact with the adhesive layer 120. In this case, the semiconductor chips 200 may be hardly detached from the adhesive layer 120 or residues of the adhesive layer 120 may be left on the picked-up semiconductor chips 200. However, according to an embodiment of the inventive concept, the substrate structure 20 may be in contact with the first release layer 130 and may be spaced apart from the adhesive layer 120. Since the adhesive strength between the first release film 130' and the substrate structure 20 is weak, it may be possible to prevent the residues of the first release film 130' from being left on the semiconductor chips 200. Accordingly, it may be possible to improve the reliability in the process of fabricating the semiconductor chips 200.

As an example, in the case where the first release film 130' is chemically bonded to the adhesive layer 120, a bonding strength between the first release film 130' and the adhesive layer 120 may be very strong. The bonding strength between the first release film 130' and the adhesive layer 120 may be stronger than a bonding strength between the first release film 130' and the semiconductor substrate 210. Accordingly, the substrate structure 20 may be more easily detached from the first release film 130'.

Since the first release film 130' has the hydrophobic property, it may be possible to more effectively prevent the residues of the first release film 130' from being left on the semiconductor chips 200. The semiconductor device may be fabricated by the method described above. The semiconductor device may be a semiconductor chip.

Hereinafter, physical characteristics of processing tapes, which were fabricated in experimental and comparative examples, will be described in more detail below.

Comparative Example

A second release layer was formed by coating silicone acrylate represented by the chemical formula 2 on a protection release film. A base layer containing poly olefin was prepared. An adhesive layer was formed by coating an acrylate-based photo-curable polymer on the base layer. A processing tape was formed by attaching the adhesive layer to the second release layer. A delamination process on the protection release film and the second release layer was performed to expose the adhesive layer. A substrate was attached to the exposed adhesive layer. A weight of 2 kg was exerted on the substrate, the adhesive layer, and the base layer, and then, a first adhesive strength between the adhesive layer and the substrate was measured. An ultraviolet light was irradiated to the processing tape, and then, a second adhesive strength between the second release layer and the substrate was measured. The measurements of the first and second adhesive strengths were conducted on a stainless steel (SUS) substrate and a bare wafer substrate, respectively.

Experimental Example 1

A second release layer was formed by coating silicone acrylate represented by the chemical formula 2 in which $R_4$ is methyl on a protection release film. A first release layer was formed by coating a silicone-based material represented by the chemical formula 1 in which $R_1$ and $R_2$ are H and where $R_3$ is methyl on the second release layer.

A base layer containing poly olefin was prepared. An adhesive layer was formed by coating an acrylate-based photo-curable polymer on the base layer. A processing tape was formed by attaching the adhesive layer to the first release layer. A processing release tape was formed by performing a delamination process on the protection release film and the second release layer. Here, 30 wt % of the first release layer was left on the adhesive layer. The remaining portion of the first release layer will be referred to as a first release film. The processing release tape was composed of the base layer, the adhesive layer, and the first release film.

A substrate was attached to the first release film. A weight of 2 kg was exerted on the substrate and the processing release tape, and then, a first adhesive strength between the first release film and the substrate was measured. An ultraviolet light was irradiated to the processing release tape, and then, a second adhesive strength between the first release layer and the substrate was measured. The measurements of the first and second adhesive strengths were conducted on a stainless steel (SUS) substrate and a bare wafer substrate, respectively.

Experimental Example 2

A processing release tape was fabricated by substantially the same method as in the experimental example 1, and then, the first and second adhesive strengths were measured. The measurements of the first and second adhesive strengths were conducted on a stainless steel (SUS) substrate and a bare wafer substrate, respectively. However, in the case of the experimental example 2, after the delamination process on the protection release film and the second release layer, 10 wt % of the first release layer was left on the adhesive layer to form the first release film.

Table 1 summarizes the first and second adhesive strengths measured on the stainless steel substrate in the experimental examples 1 and 2 and the comparative example. In Table 1, the first adhesive strength is an adhesive strength measured before the UV irradiation, and the second adhesive strength is an adhesive strength measured after the UV irradiation. Each of the first and second adhesive strengths was measured three times, and a value written in Table 1 is an average value.

TABLE 1

| | Ratio of first release film to first release layer (wt %) | First adhesive strength (gf/inch) | Second adhesive strength (gf/inch) |
|---|---|---|---|
| Experimental Example 1 | 30 | 471 | 29.2 |
| Experimental Example 2 | 10 | 537 | 48.9 |
| Comparative Example | — | 604 | 61.1 |

Table 2 summarizes the first and second adhesive strengths measured on the bare wafer substrate in the experimental examples 1 and 2 and the comparative example. In Table 2, the first adhesive strength is an adhesive strength measured before the UV irradiation, and the second adhesive strength is an adhesive strength measured after the UV irradiation. Each of the first and second adhesive strengths was measured three times, and a value written in Table 2 is an average value.

TABLE 2

| | Ratio of first release film to first release layer (wt %) | First adhesive strength (gf/inch) | Second adhesive strength (gf/inch) |
|---|---|---|---|
| Experimental Example 1 | 30 | 95.9 | 2.96 |
| Experimental Example 2 | 10 | 127.6 | 4.29 |
| Comparative Example | — | 175.5 | 7.45 |

Referring to Tables 1 and 2, in the case of the comparative example, the processing release tape did not include the first release film. In the cases of the experimental examples 1 and 2, the second adhesive strength was much smaller than the first adhesive strength. In the cases of the experimental examples 1 and 2, the adhesive strength between the first release film and the substrate was significantly reduced after the UV irradiation. A reduction ratio of the second adhesive strength to the first adhesive strengths in the experimental examples 1 and 2 was greater than a reduction ratio of the second adhesive strength to the first adhesive strength in the comparative example.

The first adhesive strengths in the experimental examples 1 and 2 were smaller than the first adhesive strength in the comparative example. The first adhesive strengths in the experimental examples 1 and 2 were about 0.5 to about 0.9 times the first adhesive strength in the comparative example. Depending upon the materials and thicknesses selected for the adhesive and release layers, the first adhesive strengths in the experimental examples 1 and 2 can generally be from 0.3 to 0.9 times the first adhesive strength in the comparative example. The second adhesive strengths in the experimental examples 1 and 2 were smaller than the second adhesive strength in the comparative example. The second adhesive strengths in the experimental examples 1 and 2 were 0.4 to 0.8 times the second adhesive strength in the comparative example. Depending upon the materials and thicknesses selected for the adhesive and release layers, the second adhesive strengths in the experimental examples 1 and 2 can generally be from 0.3 to 0.9 times the second adhesive strength in the comparative example.

Referring to FIGS. 4E and 4F and Table 2, an adhesive strength between the first release film 130' and the substrate structure 20 after the irradiation of the light was smaller than an adhesive strength between the first release film 130' and the substrate structure 20 before the irradiation of the light. For example, the adhesive strength between the first release film 130' and the semiconductor substrate 210 before the irradiation of the light may be from 0.5 N/inch to 5 N/inch, and the adhesive strength between the first release film 130' and the semiconductor substrate 210 after the irradiation of the light may be from 0.01 N/inch to 0.05 N/inch. 0.5 N/inch to 5 N/inch correspond to 51 gf/inch to 510 gf/inch, and 0.01 N/inch to 0.05 N/inch correspond to 1.02 gf/inch to 5.1 gf/inch. Unlike that shown in the figure, the semiconductor substrate 210 may be a bare wafer substrate, such as a bare silicon wafer. Other conductive elements or circuits on a surface of the bare wafer substrate may not be exposed. However, the semiconductor substrate 210 according to an embodiment of the inventive concept is not limited to the bare wafer.

Figure 5A:
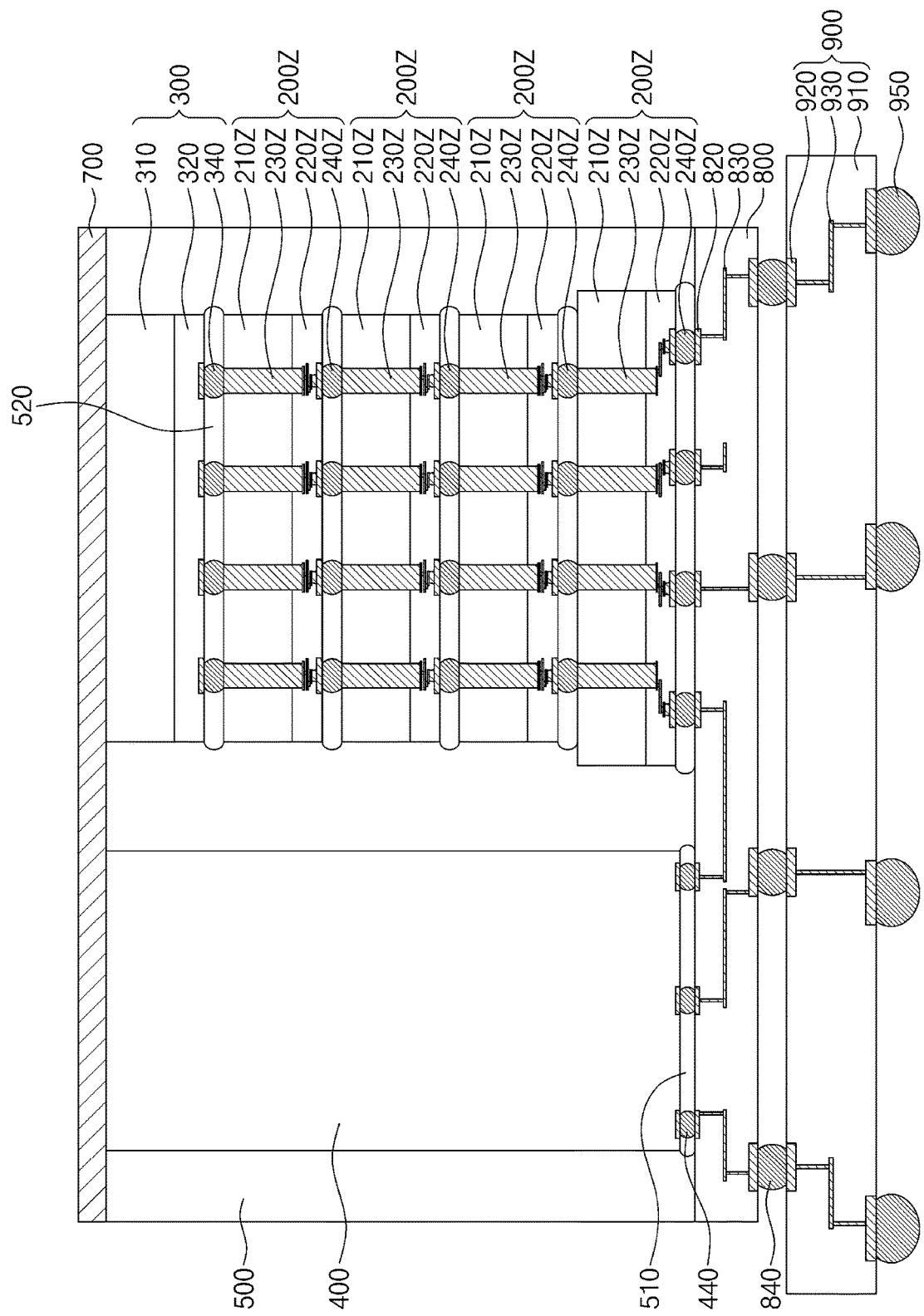
FIG. 5A is a sectional view illustrating a semiconductor package according to an embodiment of the inventive concept.

FIG. 5A is a sectional view illustrating a semiconductor package according to an embodiment of the inventive concept. For concise description, a previously described element may be identified by the same reference number without repeating an overlapping description thereof.

Referring to FIG. 5A, a semiconductor package may include a package substrate 900, an outer terminal 950, an interposer bump 840, an interposer substrate 800, a semiconductor device 400, and a first semiconductor chip 200Z. The semiconductor package may further include at least one of a second semiconductor chip 300, a mold layer 500, a first under-fill layer 510, a second under-fill layers 520, or a heat-dissipation structure 700.

The package substrate 900 may include an insulating base layer 910, a substrate pad 920, and an internal interconnection line 930. The insulating base layer 910 may include a plurality of stacked layers. The substrate pad 920 may be exposed on a top surface of the package substrate 900. The internal interconnection line 930 may be disposed in the insulating base layer 910 and may be electrically connected to the substrate pad 920. In the present specification, the expression "two elements are electrically connected or coupled to each other" may mean that the elements are directly connected or coupled to each other or are indirectly connected or coupled to each other through other conductive elements. The expression "an element is electrically connected to the package substrate 900" may mean that the element is electrically connected to the internal interconnection line 930. The substrate pad 920 and the internal interconnection line 930 may be formed of or include at least one of metallic materials (e.g., copper, aluminum, tungsten, and/or titanium). As an example, the package substrate 900 may be a printed circuit board (PCB). As another example, a redistribution layer may be used as the package substrate 900.

The outer terminal 950 may be provided on a bottom surface of the package substrate 900 and may be coupled to the internal interconnection line 930. The outer terminal 950 may include a solder ball. The outer terminal 950 may be formed of or include at least one of solder materials. The solder materials may include tin (Sn), silver (Ag), zinc (Zn), and/or alloys thereof.

The interposer substrate 800 may be disposed on the package substrate 900. The interposer substrate 800 may include a metal pad 820 and a metal line 830. The metal pad 820 may be exposed on a top surface of the interposer substrate 800. The metal line 830 may be provided in the interposer substrate 800 and may be coupled to the metal pad 820. In the present specification, the expression "an element is electrically connected to the interposer substrate 800" may mean that the element is electrically connected to the metal line 830. The metal pad 820 and the metal line 830 may be formed of or include at least one of metallic materials (e.g., copper, aluminum, tungsten, and/or titanium).

The interposer bump 840 may be interposed between the package substrate 900 and the interposer substrate 800 and may be coupled to the package substrate 900 and the interposer substrate 800. The interposer bump 840 may include a solder material.

The semiconductor device 400 may be disposed on the top surface of the interposer substrate 800. The semiconductor device 400 may include a semiconductor chip (e.g., a logic chip, a buffer chip, or a system-on-chip (SOC)). The semiconductor device 400 may include, for example, an application specific integrated circuit (ASIC) chip or an application processor (AP) chip. The semiconductor device 400 may be a semiconductor chip including at least one of a central processing unit (CPU) or a graphic processing unit (GPU).

A bump terminal 440 may be interposed between the interposer substrate 800 and the semiconductor device 400 and may be electrically connected to the interposer substrate 800 and the semiconductor device 400. For example, the bump terminal 440 may include a solder material. The first under-fill layer 510 may be provided in a gap region between the interposer substrate 800 and the semiconductor device 400 to encapsulate or seal the bump terminal 440. The first under-fill layer 510 may be formed of or include an insulating polymer (e.g., epoxy-based polymers).

The first semiconductor chip 200Z may be disposed on the top surface of the interposer substrate 800 to be horizontally spaced apart from the semiconductor device 400. In an embodiment, the semiconductor package may include a plurality of the first semiconductor chips 200Z, which are stacked on the top surface of the interposer substrate 800. The first semiconductor chips 200Z may be semiconductor chips that are of a kind different from the semiconductor device 400. The first semiconductor chips 200Z may include high bandwidth memory (HBM) chips. The first semiconductor chips 200Z may include DRAM chips. However, the lowermost of the first semiconductor chips 200Z may be a logic chip and may have a different function from the semiconductor device 400. A width of the lowermost of the first semiconductor chips 200Z may be different from a width of the others of the first semiconductor chips 200Z, but the inventive concept is not limited to this example.

Each of the first semiconductor chips 200Z may include the first solder bumps 240Z, a first circuit layer 220Z, a first semiconductor substrate 210Z, and the first penetration structures 230Z. The first solder bumps 240Z, the first circuit layer 220Z, the first semiconductor substrate 210Z, and the first penetration structures 230Z may be substantially the same as the solder bumps 240Z, the circuit layer 220, the semiconductor substrate 210, and the penetration structures 230, respectively, which were described with reference to FIGS. 4C to 4F. The first semiconductor chips 200Z may include a lower semiconductor chip and an upper semiconductor chip, which are adjacent to each other. The upper semiconductor chip may be disposed on the lower semiconductor chip. The first solder bumps 240Z of the upper semiconductor chip may be electrically connected to the first penetration structures 230Z, respectively, of the lower semiconductor chip. In the present specification, the expression "an element is electrically connected to the semiconductor chip" may mean that the element is electrically connected to the integrated circuits in the semiconductor chip. At least one of the first semiconductor chips 200Z may be formed by the process of dicing the substrate structure 20 using the processing tape 10, described with reference to FIGS. 4A to 4F. Any residue of the first release layer 130 may not be left on the top surfaces of the first semiconductor chips 200Z. This may make it possible to realize reliable electric connection between the first semiconductor chips 200Z.

The second semiconductor chip 300 may be disposed on the uppermost one of the first semiconductor chips 200Z. The second semiconductor chip 300 may include a high bandwidth memory chip. The second semiconductor chip 300 may include a second semiconductor substrate 310, a second circuit layer 320, and second solder bumps 340, but may not include any penetration structure. The second solder bumps 340 may be respectively coupled to the first penetration structures 230Z of the uppermost one of the first semiconductor chips 200Z. The second semiconductor substrate 310, the second circuit layer 320, and the second solder bumps 340 may be substantially the same as the semiconductor substrate 210, the circuit layer 220, and the solder bumps 240Z, respectively, described with reference to FIGS. 4C to 4F. In an embodiment, the second semiconductor chip 300 may be omitted.

The second under-fill layers may be provided in first gap regions between the first semiconductor chips 200Z to seal corresponding ones of the first solder bumps 240Z and the interposer substrate 800. The third under-fill layer 520 may be further provided in a second gap region between the uppermost one of the first semiconductor chips 200Z and the second semiconductor chip 300. The fourth under-fill layer may be further provided in a fourth gap region between the substrate structure 20 and the lowermost of the first semiconductor chips 200Z. The second under-fill layers, the third under-fill layer 520, and the fourth under-fill layer may be formed of or include an insulating polymer (e.g., epoxy-based polymers).

The mold layer 500 may be provided on the package substrate 900 to cover the semiconductor device 400, the first semiconductor chips 200Z, and the second semiconductor chip 300. The mold layer 500 may be formed to expose the top surface of the semiconductor device 400 and the top surface of the second semiconductor chip 300, but the inventive concept is not limited to this example. The mold layer 500 may be formed of or include an insulating polymer (e.g., epoxy-based polymers).

The heat-dissipation structure 700 may be disposed on at least one of the top surface of the semiconductor device 400 and the top surface of the second semiconductor chip 300. The heat-dissipation structure 700 may further cover the top surface of the mold layer 500. The heat-dissipation structure 700 may be further extended to cover the side surface of the mold layer 500. The heat-dissipation structure 700 may include a heat slug or a heat sink. The heat-dissipation structure 700 may be formed of or include materials (e.g., metals) having high thermal conductivity.

Figure 5B:
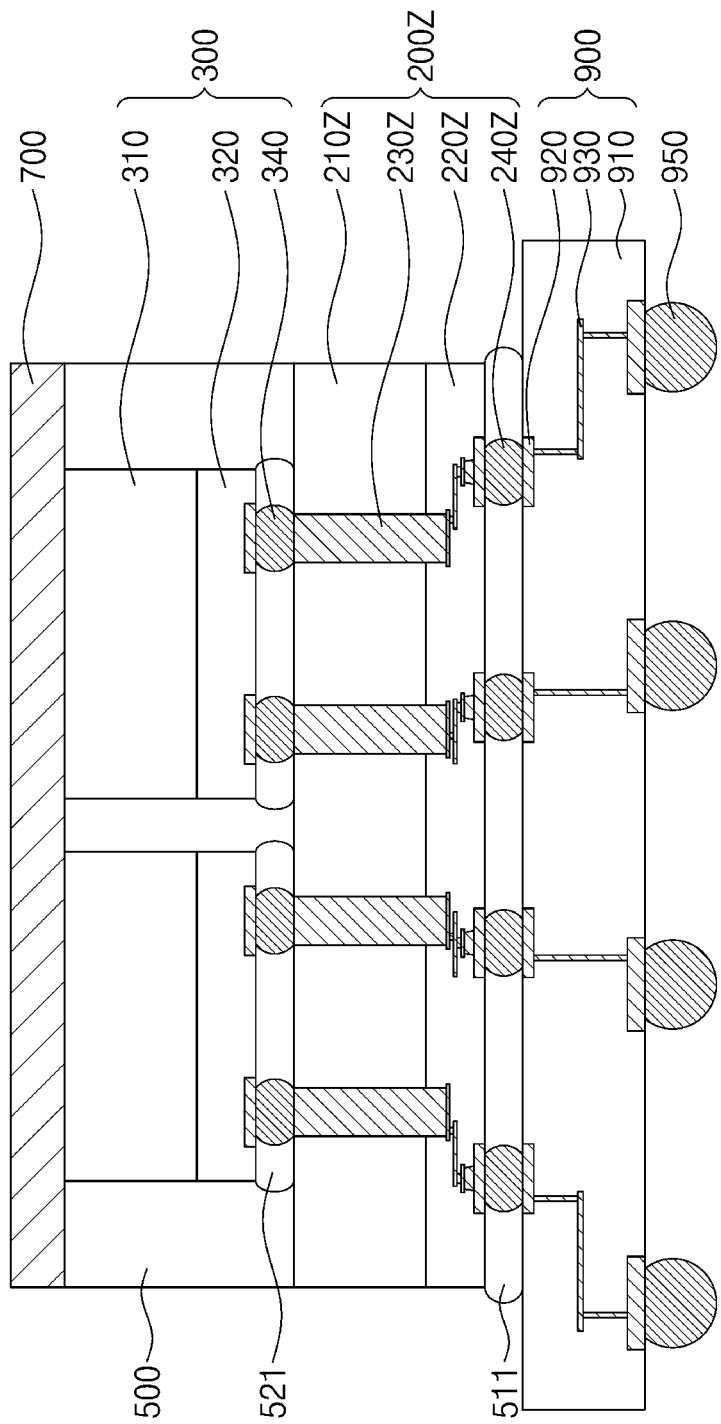
FIG. 5B is a sectional view illustrating a semiconductor package according to an embodiment of the inventive concept

FIG. 5B is a sectional view illustrating a semiconductor package according to an embodiment of the inventive concept. For concise description, a previously described element may be identified by the same reference number without repeating an overlapping description thereof.

Referring to FIG. 5B, the semiconductor package may include the package substrate 900, the outer terminal 950, the first semiconductor chip 200Z, and the second semiconductor chip 300. The semiconductor package may further include the mold layer 500, a first under-fill pattern 511, second under-fill patterns 521, and the heat-dissipation structure 700. The package substrate 900 and the outer terminal 950 may be substantially the same as those described with reference to FIG. 5A.

The first semiconductor chip 200Z may be mounted on the package substrate 900. The first semiconductor chip 200Z may be one of the semiconductor chips 200, which are formed by a process of dicing the substrate structure 20 using the processing tape 10, described with reference to FIGS. 4A to 4F. Each of the first semiconductor chips 200Z may include the first solder bumps 240Z, the first circuit layer 220Z, the first semiconductor substrate 210Z, and the first penetration structures 230Z. The first solder bumps 240Z may be coupled to a plurality of substrate pads 920, respectively. The first semiconductor chip 200Z may be a logic chip.

The second semiconductor chip 300 may be disposed on the first semiconductor chip 200Z. The second semiconductor chip 300 may be configured to have features similar to the second semiconductor chip 300 described with reference to FIG. 5A. For example, the second semiconductor chip 300 may include the second solder bumps 340, the second circuit layer 320, and the second semiconductor substrate 310, but may not include any penetration structure. The second semiconductor chip 300 may be a memory chip (e.g., an SRAM chip). The second solder bumps 340 may be electrically connected to the first penetration structures 230Z, respectively. Accordingly, the second semiconductor chip 300 may be electrically connected to the first semiconductor chip 200Z or the outer terminal 950. In an embodiment, a plurality of the second semiconductor chips 300 may be provided and may be horizontally spaced apart from each other.

The first under-fill pattern 511 may be provided in a first gap region between the package substrate 900 and the first semiconductor chip 200Z to seal the first solder bumps 240Z. The second under-fill patterns 521 may be respectively disposed in second gap regions between the first semiconductor chip 200Z and the second semiconductor chips 300. Each of the second under-fill patterns 521 may seal corresponding ones of the second solder bumps 340. The first under-fill pattern 511 and the second under-fill patterns 521 may be formed of or include an insulating polymer (e.g., epoxy-based polymers).

The mold layer 500 may be disposed on the top surface of the first semiconductor chip 200Z to cover the second semiconductor chips 300. The mold layer 500 may be provided to expose the top surfaces of the second semiconductor chips 300. The heat-dissipation structure 700 may be disposed on the top surfaces of the second semiconductor chips 300 and the top surface of the mold layer 500. The heat-dissipation structure 700 may be extended to cover the side surface of the mold layer 500.

According to an embodiment of the inventive concept, a processing release tape may include a first release layer. A substrate structure may be attached to the first release layer, and then, a process of processing the substrate structure may be performed. An adhesive strength between the first release layer and the substrate structure may be high enough to allow the first release layer to stably fasten the substrate structure during the processing process. After the processing process, light may be irradiated to the processing release tape. In this case, the adhesive strength between the first release layer and the substrate structure may be sufficiently lowered. Accordingly, the substrate structure may be easily detached from the first release layer. There may be no residue of the first release layer on the detached substrate structure.

While example embodiments of the inventive concept have been particularly shown and described, it will be understood by one of ordinary skill in the art that variations in form and detail may be made therein without departing from the spirit and scope of the attached claims.

What is claimed is:

1. A processing tape, comprising:
   a base layer;
   an adhesive layer disposed on the base layer;
   a protection release film on the adhesive layer; and
   a first release layer interposed between the adhesive layer and the protection release film,
   a second release layer interposed between the first release layer and the protection release film;
   wherein the first release layer comprises a silicone-based material and is non-photo-curable;
   wherein the second release layer comprises a silicone acrylate-based material; and
   wherein the silicone-based material of the first release layer is represented by Chemical Formula 1;

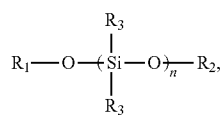

[Chemical Formula 1]

wherein $R_1$ and $R_2$ each independently includes one selected from a hydrogen, an alkyl group having 1 to 5 carbon atoms, an alkyl substituted silyl group having 1 to 5 carbon atoms, —$NH_2$, an alykl amino group having 1 to 5 carbon atoms, a hydroxyl group (—OH), a hydroxy alkyl group having 1 to 5 carbon atoms, an isocyanate group (NCO), an alkyl group having 1 to 5 carbon atoms substituted with isocyanate, and an alkyl group having 1 to 5 carbon atoms substituted with epoxy group, $R_3$ each independently includes one selected from an alkyl group having 1 to 3 carbon atoms and n is 1 to 410.

2. The processing tape of claim 1, wherein the adhesive layer comprises an acrylate-based material and is photo-curable.

3. The processing tape of claim 1, wherein the first release layer is a thermoset, and
   in the Chemical Formula 1, $R_1$ and $R_2$ is each independently any one selected from —$NH_2$, an alkyl amino group having 1 to 5 carbon atoms, a hydroxyl group (—OH), a hydroxy alkyl group having 1 to 5 carbon atoms, an isocyanate group (NCO), an alkyl group having 1 to 5 carbon atoms substituted with isocyanate, and an alkyl group having 1 to 5 carbon atoms substituted with epoxy group.

4. The processing tape of claim 1, wherein a thickness of the first release layer ranges from 0.01 µm to 10 µm.

5. The processing tape of claim 1, wherein the first release layer is chemically bonded to the adhesive layer.

6. The processing tape of claim 1, wherein the adhesive layer comprises a pressure sensitive adhesive layer and a thickness of the adhesive layer ranges from 5 µm to 50 µm.

7. A processing tape, comprising:
   a base layer including a polymer;
   a pressure sensitive adhesive layer disposed on the base layer;
   a protection release film on the pressure sensitive adhesive layer;
   a first release layer interposed between the pressure sensitive adhesive layer and the protection release film; and
   a second release layer interposed between the first release layer and the protection release film, the second release layer comprising silicone acrylate,
   wherein the first release layer is non-photo-curable,
   the pressure sensitive adhesive layer comprises a photo-curable material,
   a thickness of the first release layer ranges from 0.01 µm to 10 µm, and
   the first release layer comprising a material represented by Chemical Formula 1,

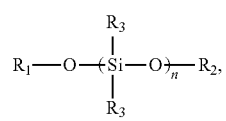

[Chemical Formula 1]

where $R_1$ and $R_2$ each independently includes one selected from a hydrogen, an alkyl group having 1 to 5 carbon atoms, an alkyl substituted silyl group having 1 to 5 carbon atoms, —$NH_2$, an alkyl amino group having 1 to 5 carbon atoms, a hydroxyl group (—OH), a hydroxy alkyl group having 1 to 5 carbon atoms, an isocyanate group (NCO), an alkyl group having 1 to 5 carbon atoms substituted with isocyanate, and an alkyl group having 1 to 5 carbon atoms substituted with epoxy group, and n is 1 to 410.

8. The processing tape of claim 7, wherein the base layer comprises at least one of polyethyleneterephthalate (PET), poly-olefin (PO), poly (vinyl alcohol) (PVA), poly(1-naphthylamine) (PNA), or poly ether ether ketone (PEEK), and
   the protection release film comprises at least one of PET, PO, PVA, PNA, or PEEK.

* * * * *